US011488887B1

(12) United States Patent
Refai-Ahmed et al.

(10) Patent No.: US 11,488,887 B1
(45) Date of Patent: Nov. 1, 2022

(54) THERMAL ENABLEMENT OF DIES WITH IMPURITY GETTERING

(71) Applicant: XILINX, INC., San Jose, CA (US)

(72) Inventors: Gamal Refai-Ahmed, Santa Clara, CA (US); Suresh Ramalingam, Fremont, CA (US); Boon Y. Ang, Sunnyvale, CA (US); Toshiyuki Hisamura, San Jose, CA (US); Suresh Parameswaran, Fremont, CA (US); Scott McCann, Sunnyvale, CA (US); Hoa Lap Do, San Jose, CA (US)

(73) Assignee: XILINX, INC., San Jose, CA (US)

( * ) Notice: Subject to any disclaimer, the term of this patent is extended or adjusted under 35 U.S.C. 154(b) by 68 days.

(21) Appl. No.: 16/810,473

(22) Filed: Mar. 5, 2020

(51) Int. Cl.
*H01L 23/367* (2006.01)
*H01L 21/306* (2006.01)
(Continued)

(52) U.S. Cl.
CPC .... *H01L 23/3675* (2013.01); *H01L 21/30604* (2013.01); *H01L 23/3736* (2013.01); *H01L 24/27* (2013.01); *H01L 24/32* (2013.01); *H01L 24/11* (2013.01); *H01L 24/16* (2013.01); *H01L 24/73* (2013.01); *H01L 24/81* (2013.01); *H01L 2224/16225* (2013.01);
(Continued)

(58) Field of Classification Search
CPC ............. H01L 23/3675; H01L 23/3733; H01L 23/3672; H01L 24/16; H01L 21/30604; H01L 23/3736; H01L 24/27; H01L 24/32; H01L 23/3142; H01L 23/42; H01L 24/17; H01L 23/04; H01L 25/18; H01L 23/10; H01L 23/3737; H01L 21/68721; H01L 23/562; H01L 21/4857; H01L 25/50; H01L 25/0655; H01L 21/4853; H01L 23/3114; H01L 21/565; H01L 21/4882; H01L 21/486; H01L 23/49822
USPC ....... 257/704, 706, 707, 714, 712, 717, 718, 257/713, 720, 723; 438/478, 599; 977/742, 842
See application file for complete search history.

(56) References Cited

U.S. PATENT DOCUMENTS 6,462,410 B1 * 10/2002 Novotny ................. H01L 23/34
257/E23.08
9,812,374 B1 * 11/2017 Refai-Ahmed ......... H01L 23/10
(Continued)

OTHER PUBLICATIONS

U.S. Appl. No. 16/786,447, filed Feb. 10, 2020 Entitled "Stacked Silicon Package Assembly Having Thermal Management".
(Continued)

*Primary Examiner* — Mouloucoulaye Inoussa
(74) *Attorney, Agent, or Firm* — Patterson + Sheridan, LLP

(57) ABSTRACT

In one example, a method includes providing a first side of a semiconductor substrate with a plurality of transistors, etching a second side of the substrate, opposite the first side, with a pattern of trenches, the trenches having a pre-defined depth and width, and providing the etched semiconductor substrate in a package. In one example, the predefined depth and width of the trenches is such so as to increase the surface area of the second side of the substrate by at least 20 percent. In one example, the method also includes providing a layer of a thermal interface material (TIM) on the second side of the substrate, including to fill at least a portion of the trenches.

9 Claims, 10 Drawing Sheets

(51) Int. Cl.
  *H01L 23/00* (2006.01)
  *H01L 23/373* (2006.01)
(52) U.S. Cl.
  CPC .............. *H01L 2224/32245* (2013.01); *H01L 2224/73253* (2013.01); *H01L 2924/3511* (2013.01)

(56) References Cited

U.S. PATENT DOCUMENTS

| | | | |
|---|---|---|---|
| 10,043,730 | B2 | 8/2018 | Refai-Ahmed et al. |
| 10,147,664 | B2 | 12/2018 | Refai-Ahmed et al. |
| 10,262,920 | B1 | 4/2019 | Refai-Ahmed et al. |
| 10,529,645 | B2 | 1/2020 | Gandhi et al. |
| 10,629,512 | B2 | 4/2020 | Pan et al. |
| 10,720,377 | B2 | 7/2020 | Refai-Ahmed et al. |
| 2003/0110788 | A1* | 6/2003 | Koeneman .............. H01L 24/75 62/259.2 |
| 2004/0264134 | A1* | 12/2004 | Cheng ................ H01L 21/4871 257/E23.099 |
| 2006/0260793 | A1* | 11/2006 | Yang ...................... H01L 23/34 165/185 |
| 2007/0155136 | A1* | 7/2007 | Chrysler ............... H01L 23/373 257/E23.11 |
| 2008/0003801 | A1* | 1/2008 | Dubin ................... H01L 23/373 438/599 |
| 2014/0168902 | A1* | 6/2014 | Park ...................... H01L 21/561 361/719 |
| 2015/0035135 | A1* | 2/2015 | Hung ...................... H01L 23/36 257/712 |
| 2015/0279761 | A1* | 10/2015 | Bet-Shliemoun ....... H01L 23/04 257/714 |
| 2016/0254211 | A1* | 9/2016 | Hsieh .................. H01L 25/0657 257/720 |
| 2018/0151472 | A1* | 5/2018 | Chen ................... H01L 23/3731 |
| 2018/0350755 | A1* | 12/2018 | Huang ................. H01L 23/3736 |
| 2018/0358280 | A1* | 12/2018 | Gandhi .................. H01L 24/73 |
| 2020/0105642 | A1 | 4/2020 | Gandhi et al. |
| 2021/0193620 | A1 | 6/2021 | Refai-Ahmed et al. |

OTHER PUBLICATIONS

U.S. Appl. No. 16/780,305, filed Feb. 3, 2020 Entitled "Thermal Heat Spreader Plate for Electronic Device".
U.S. Appl. No. 16/808,023, filed Mar. 3, 2020 Entitled "Three-Dimensional Thermal Management Apparatuses for Electronic Devices".

\* cited by examiner

THERMAL ENABLEMENT OF DIES WITH IMPURITY GETTERING

TECHNICAL FIELD

Examples of the present disclosure generally relate to heat dissipation in integrated circuits (ICs), and in particular to improving heat dissipation from the back surface of a die by increasing surface area of the back surface.

BACKGROUND

At advanced technology nodes, circuits are running much faster and thus generate a lot of heat. As a result, heat management is rapidly becoming a very challenging issue. In fact, it can halt product development if not handled efficiently. This thermal challenge becomes even greater in the development of active-on-active packaging, where heat is generated from multiple dice that are stacked on top of each other. To respond to this ongoing problem, companies are looking into novel cooling methods that range from the optimization of conventional heat sinks to very elaborate cooling techniques.

SUMMARY

Examples described herein relate to heat dissipation in ICs by increasing the surface area of a back surface of a die. With the resulting Increased surface area, greater heat conduction can occur from a silicon (Si) die to a thermal interface material (TIM) that is provided on top of it, and then to a heat removal apparatus such as, for example, a heat sink.

An example is a method. A method comprises providing a first side of a semiconductor substrate with a plurality of transistors, and etching a second side of the substrate, opposite the first side, with a pattern of trenches, the trenches having a pre-defined depth and a pre-defined width. The method further includes providing the etched semiconductor substrate in a package.

In another example the method further comprises providing the first side of the semiconductor substrate with photonics circuitry.

An example is an apparatus. An apparatus comprises a semiconductor substrate having a first side provided with a plurality of transistors, and a second side, opposite the first side, the second side etched with a pattern of trenches, the trenches having a pre-defined depth and a pre-defined width. The predefined depth and width of the trenches is such so as to increase the surface area of the second side of the substrate by at least 20 percent.

These and other aspects may be understood with reference to the following detailed description.

BRIEF DESCRIPTION OF THE DRAWINGS

So that the manner in which the above recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Examples described herein relate to structures and methods to spread heat at the die level of an IC. The structure according to various examples disclosed herein improves heat removal from dice by increasing the surface area at a back surface of the die. With the increased surface area, more heat conduction can occur from, for example, a silicon die to a TIM, and from there to a heat removal apparatus such as, for example, a heat sink.

Additionally, during the process of increasing the backside surface area of a die, crystal defects are created near the back surface of the die's substrate. Because such crystal defects, occurring at the backside of the die, are far away from the active circuit regions, they do not adversely impact the circuit. Rather, they actually improve its operation, by acting as trapping sites for mobile impurities (especially metallic impurities) and thus provide a beneficial gettering effect. With the impurities kept away from transistor active regions, PN junction leakage is reduced and transistor performance is improved. In fact, the improved transistor performance and transistor universal curve can in turn assist thermal management by reducing circuit power consumption without compromising circuit performance.

Methods and techniques according to various examples described herein may be applied to active-on-active (AoA) 3D packages, SSIT packages and conventional flip-chip packages, for example.

Figure 1:
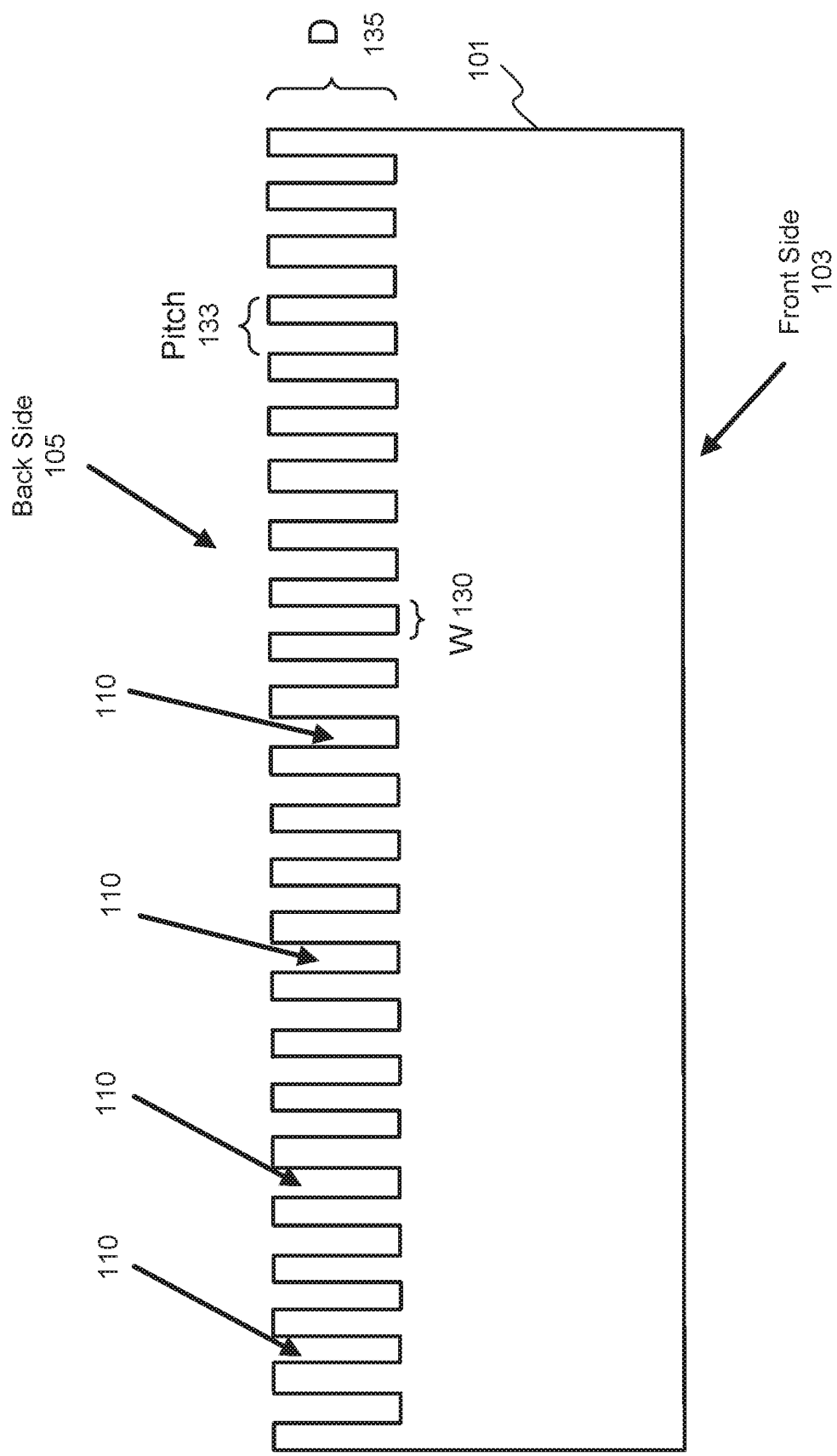
FIG. 1 is an example of a silicon die with etching on its back side, according to some examples.

FIG. 1 depicts an example silicon die with etching on its back side, according to some examples. With reference thereto, there is shown a semiconductor die 101 with a front side 103 and a back side 105. As shown, the example die may be a single die in a flip-chip configuration or may be in a typical active on active (AoA) or stacked IC orientation, where the upper dies in a multiple die stack have their front sides facing downwards and their back sides facing upwards. In one or more embodiments the front side 103 is provided with a plurality of transistors (not shown). In one or more embodiments, the front side is also provided with photonic circuitry.

Continuing with reference to FIG. 1, now referring to the back side 105 of die 101, it has been processed to have a set of trenches 110. The trenches have a pre-defined depth D 135, width W 130, and are placed at a pitch 133. In one or more embodiments, the trenches may be created using several different techniques, including, for example, without limitation, dry (plasma) etching of silicon, mechanical lapping of silicon, and laser etching into silicon. In one or more embodiments, the desired depth D 135 of the trenches can be achieved through careful optimization of each technique. In one or more embodiments, trenches 110 are created on the top die of an active-on-active 3D package, or, for example, the top die sitting on top of an interposer in an SSIT package, or, for example, the die in a conventional flip-chip package.

In one or more embodiments, the trenches increase the surface area of the back side of the die, thus increasing its thermal conductivity, and ability to dissipate heat generated by the active front side 103 of the die 101. In one or more embodiments, the pitch 133, and dimensions D 135 and W 130 are chosen so as to increase the surface area of the back side of the die 101 by at least 20%.

It is noted that the example trenched die of FIG. 1 illustrates a first example option to improve heat dissipation from a die, where after patterning trenches on the back side of the die, as shown, the trenches are subsequently filled with a TIM prior to the attachment of a package lid, as shown, for example in FIGS. 4 and 9, and described in detail below. In this first option, filling the trenches with the TIM thus increases the area for heat removal from the die. This interface area can be further increased by having trench patterns in the package lid, or, in the case of a lid-less package, in the heat sink. In one embodiment, the trench patterns in the lid or heat sink, as the case may be, are the reverse of the trench patterns on the silicon die.

Alternatively, in an example second option, instead of filing the trenches with a TIM, they may be filled with a conductive metal, such as copper. This is illustrated in FIG. 2, next described.

Figure 2:
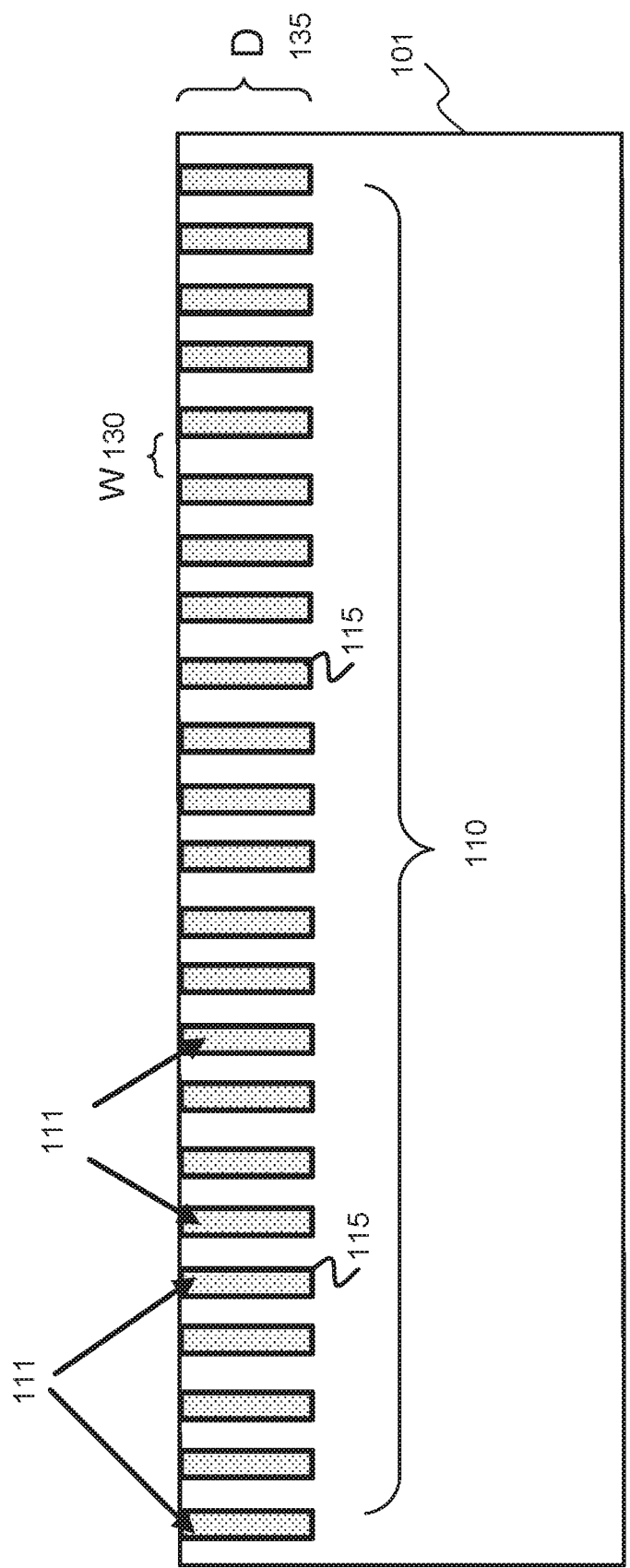
FIG. 2 is an example of an etched die with a conducting copper filler, according to some examples.

FIG. 2 is an example of an etched die with a conducting copper filler, according to some examples, thus implementing the second example option. In this second option, after the trenches are created in the back side of the die, the trenches are filled with copper by copper plating. Copper, being a good thermal conductor, reduces the interface thermal resistance. Combined with the increased surface area in the trenches, this second example option can provide even more efficient heat conduction away from the die. Additionally, as is the case with the first example option, embodiments of the second option may be further enhanced with trench patterns in a package lid, for packages with lids, or in a heat sink, in examples with lid-less packages.

Thus, FIG. 2 depicts the patterned die 101 of FIG. 1, with copper fillers 111 in each of the trenches. In addition, between the outer surface of each trench 110, and the copper filler 111, there is a copper diffusion barrier layer 115, discussed below with reference to FIG. 3. In one example the copper diffusion barrier layer may be silicon nitride (SiN). In another example it may be tantalum nitride, TaN. In still other examples other appropriate materials may be used. Otherwise, the die 101 is identical in all other respects to die 101 of FIG. 1.

Figure 3:
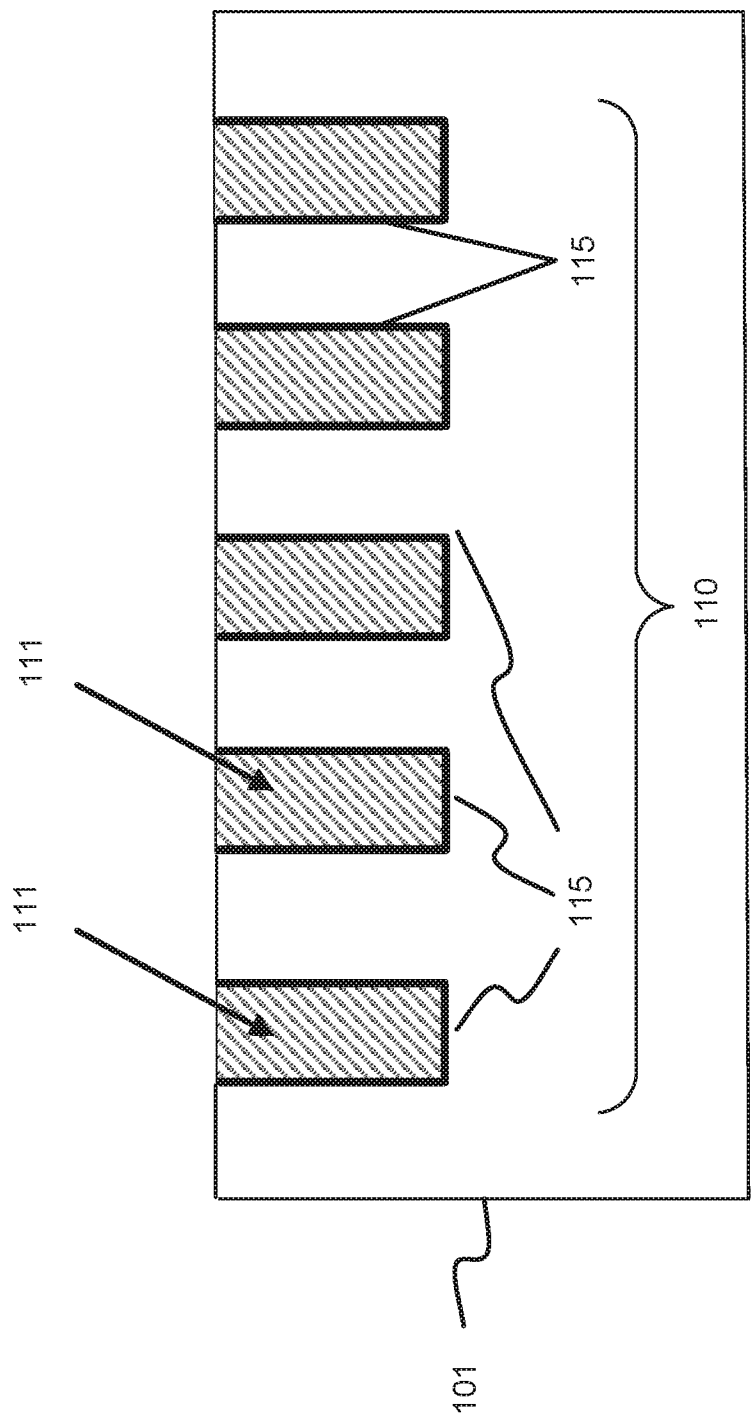
FIG. 3 depicts a magnified portion of the backside of the die shown in FIG. 2, according to some examples.

FIG. 3 depicts a magnified portion of the backside of the die shown in FIG. 2. In particular, it shows a magnified version of the first four trenches on the left of die 101 as shown in FIG. 2. As shown, there is an optional layer 115 (represented by the thick line around the inner surface of each trench) provided between the outer surface of trenches 110 and the respective copper fillers 111. Optional layer 115 is a copper diffusion barrier layer 115 that is first deposited on the inner surfaces of the trenches 110 after they have been patterned, and prior to the die being copper plated so that the trenches 110 are filled with the copper fillers 111. In one or more examples, the copper diffusion layer 115 is optional and is to prevent copper from diffusing into the silicon substrate.

Figure 4:
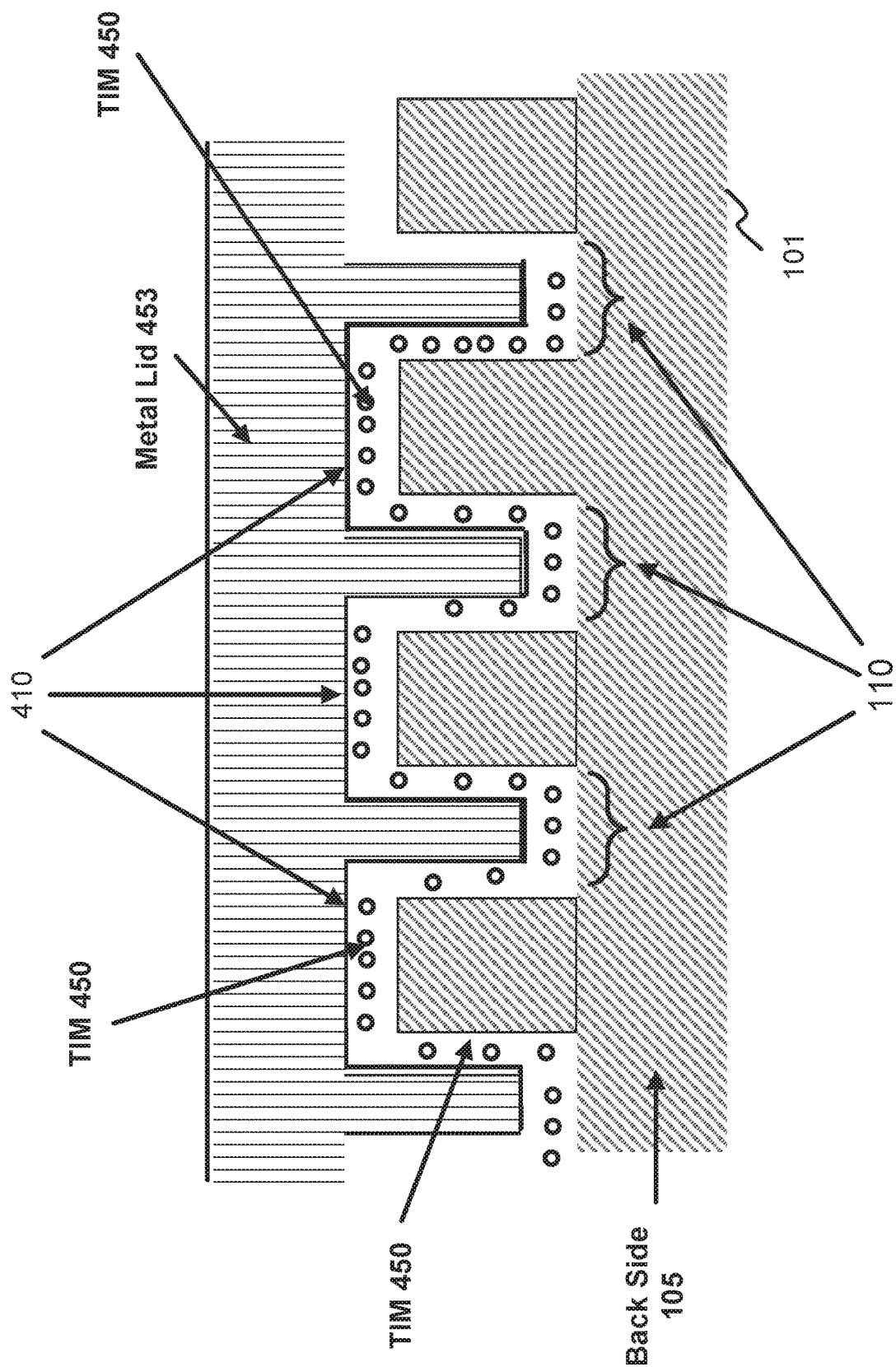
FIG. 4 is an example of an etched die as covered by an etched metal lid, with a thermal insulation material (TIM) provided between the die and the metal lid, according to some examples.

FIG. 4 is an example of an etched die as covered by an etched metal lid, with a TIM provided between the die and the metal lid, according to some examples. As noted above, this is an example embodiment where the first option is used, where the patterned trenches are simply filled with a TIM, with no metal plating of the trenches. With reference thereto there is shown silicon die 101, which has been patterned with trenches 110. There is also shown a metal lid 453, itself patterned with trenches 410. In one or more embodiments, the trenches 410 have an opposite pattern to the trenches 110 provided in the silicon die 101, and thus, the respective trenches 110 and 410 neatly fit within each other. Between the two opposing sets of trenches 110 and 410 there is provided a TIM 450, represented in FIG. 4 by a series of hollow dots.

In one or more embodiments, the TIM 450 may be an organic thermal interface, a thermal grease, a thermal gel or a two-phase thermal interface. In some examples TIM 450 may be organic materials, such as grease, gel (e.g., Shin-Etsu G749), or phase change materials such as, for example, Laird PCM780SP, or graphite materials. In one or more embodiments, the TIM is configured to act as a reservoir to release or relax thermo-mechanical stresses due to warpage between the back side of the die and a thermal management solution (e.g., metal lid or heat sink) provided on the back side of the die.

Figure 5:
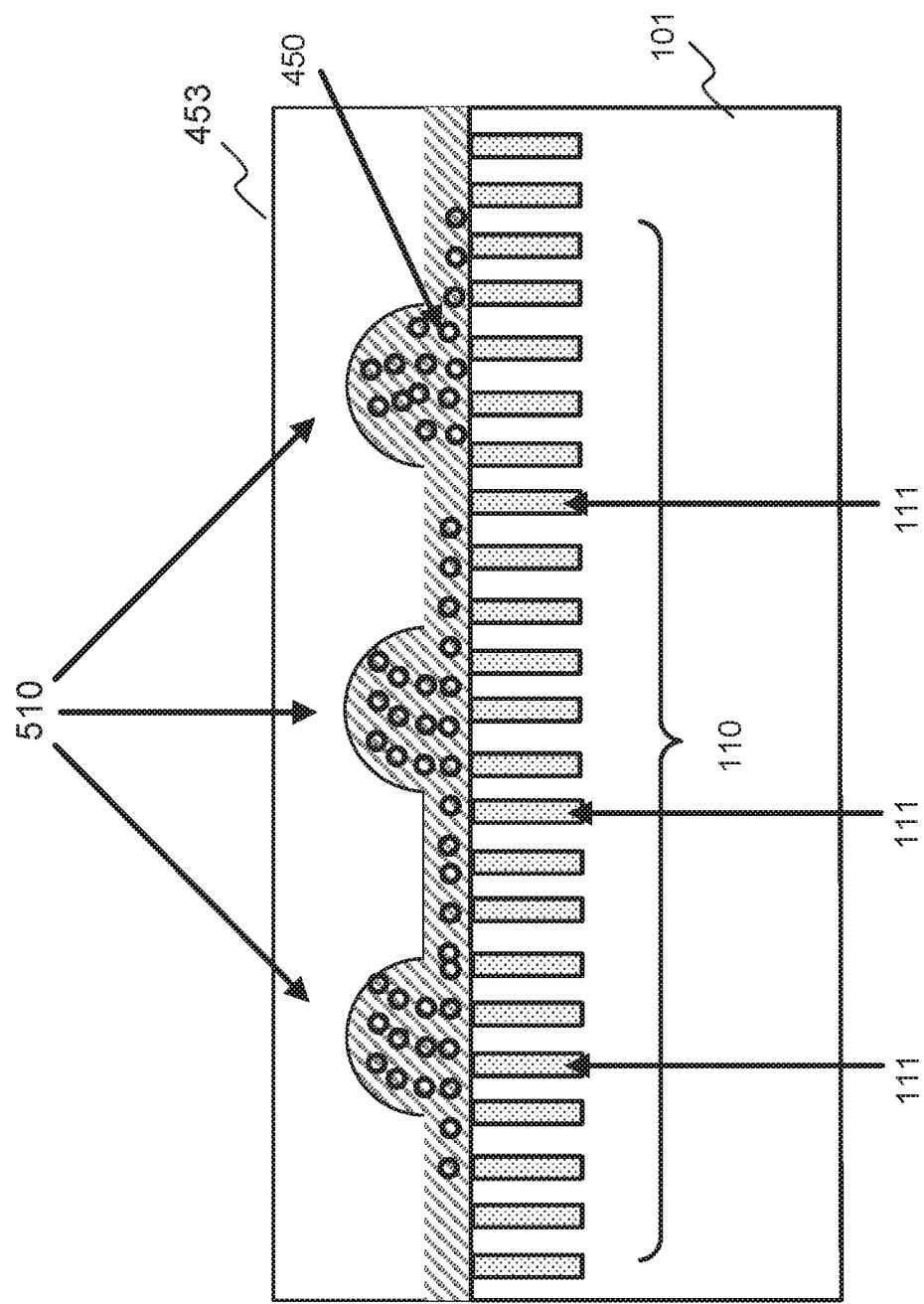
FIG. 5 is an example of an etched die with conducting fillers inserted in its trenches, covered by an etched metal lid, with a thermal insulation material (TIM) provided between the die and the metal lid, according to some examples.

Turning now to FIG. 5, the second example option described above, where metallic fillers are used to fill the trenches, is illustrated with both a TIM and an example metal lid, according to some examples. Thus, FIG. 5 depicts an example etched die 101 with conducting fillers 111 respectively inserted in its trenches, covered by an etched metal lid 453. As shown, the metal lid is also etched with a pattern of trenches 510, and, in contrast to the pattern of trenches 410 of FIG. 4, in this example of FIG. 5 they are not the precise opposite of the pattern of trenches 110 of the die 101. Rather, the example trenches 510 have rounded bottoms, essentially half cylinders recessed into the top side of metal lid 453. It is noted that the trenches 510, or the trenches 110, may be of many shapes, and rectangular trenches such as 110 or 410 of FIG. 4, or rounded trenches such as 510, are each one of many possible implementations. As also shown in FIG. 5, there is a TIM 450 provided between the die 101 and the metal lid 453. The TIM, as noted above, may be an organic thermal interface, a thermal grease, a thermal gel or a two-phase thermal interface.

It is noted that the patterns etched on the top surface of a metal lid may be provided by, for example, CNC machining, stamping force or laser etching.

Figure 6:
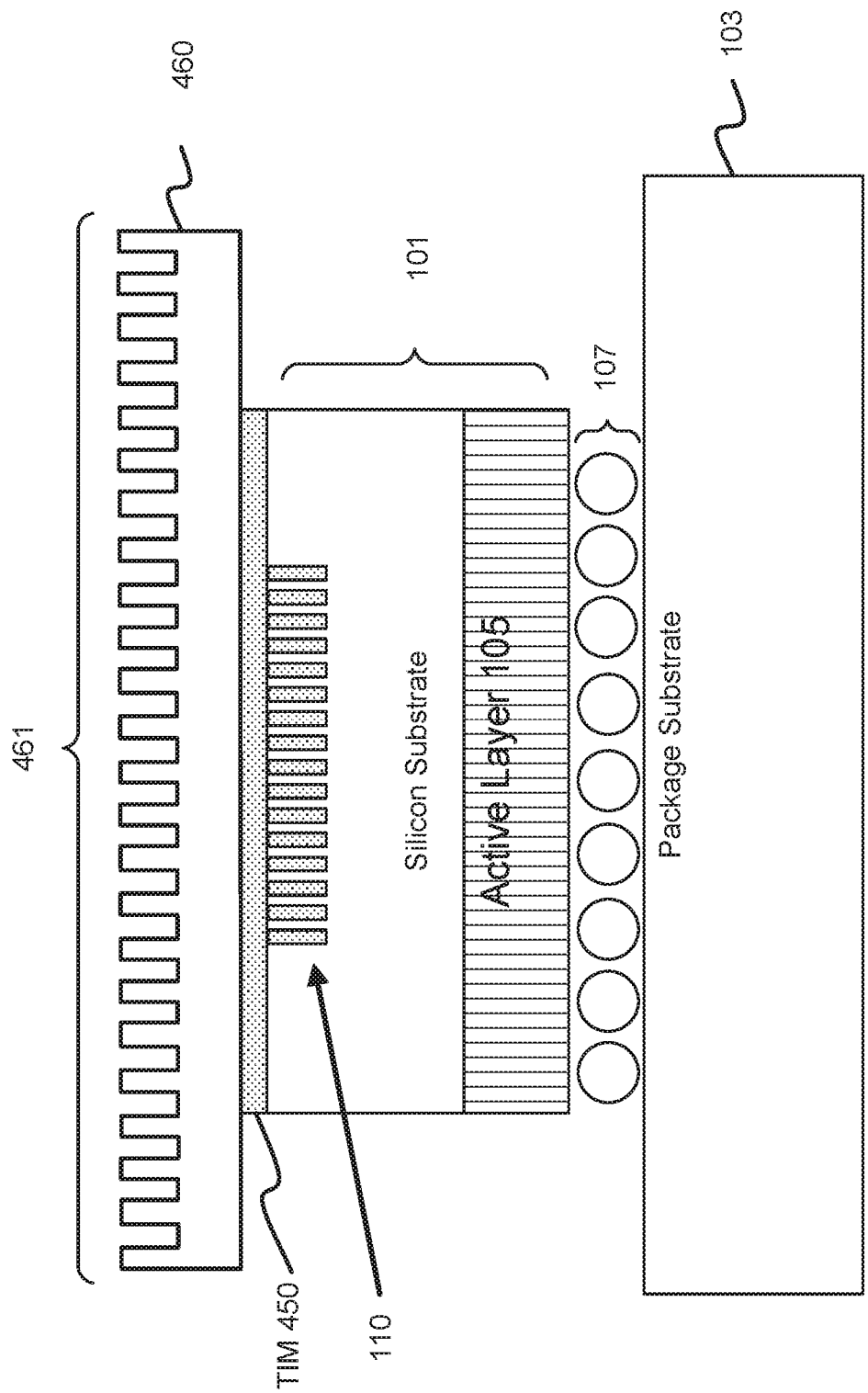
FIG. 6 is an example die as provided in a package, according to some examples.

FIG. 6 is an illustration of an example die 101 as provided in an example package, according to some examples. With reference thereto, die 101 comprises a silicon substrate 102, with an active layer 105 on its front side. Active layer 105 is provided with a plurality of transistors and possibly photonics circuitry, and one or more metal layers. The front side of die 101 is connected to a package substrate 103 by a set of solder bumps 107, as shown. The solder bumps 107, for example, are electrically connected to an upper metal layer of the active region 105. The back side of die 101 has been etched with a pattern of trenches 110, as described in detail above. It is noted that in some examples the trenches 110 may additionally be filled with a copper diffusion barrier layer and copper filler, as described above with reference to FIG. 5. In other examples, the trenches may be filled with a TIM.

The example package of FIG. 6 is a lidless example, and thus there is no metal lid attached to the back side of die 101. However, there is attached to the back side of the die 101 a heat sink, or thermal management device 460, with fins 461 to dissipate heat. In some examples, the bottom surface (facing the die) of the heat sink 460 is etched with a pattern of trenches, as shown, for example, in FIG. 4, where an opposite pattern is etched in the thermal management device, or FIG. 5, where a different pattern is etched in the surface of the thermal management device facing the die. It is noted that while the examples of FIGS. 4 and 5 relate to etching a pattern in the top surface of a metal lid, the same patterns that are shown in these figures may also be etched in the surface of a thermal management device facing the die. Between the thermal management device 460 and the trenched back side of die 101 there is also provided a TIM 450. As noted above, in other examples a die need not be packaged in a lidless manner, but rather, may also include a lid. This variation is next described, with reference to FIG. 7.

Figure 7:
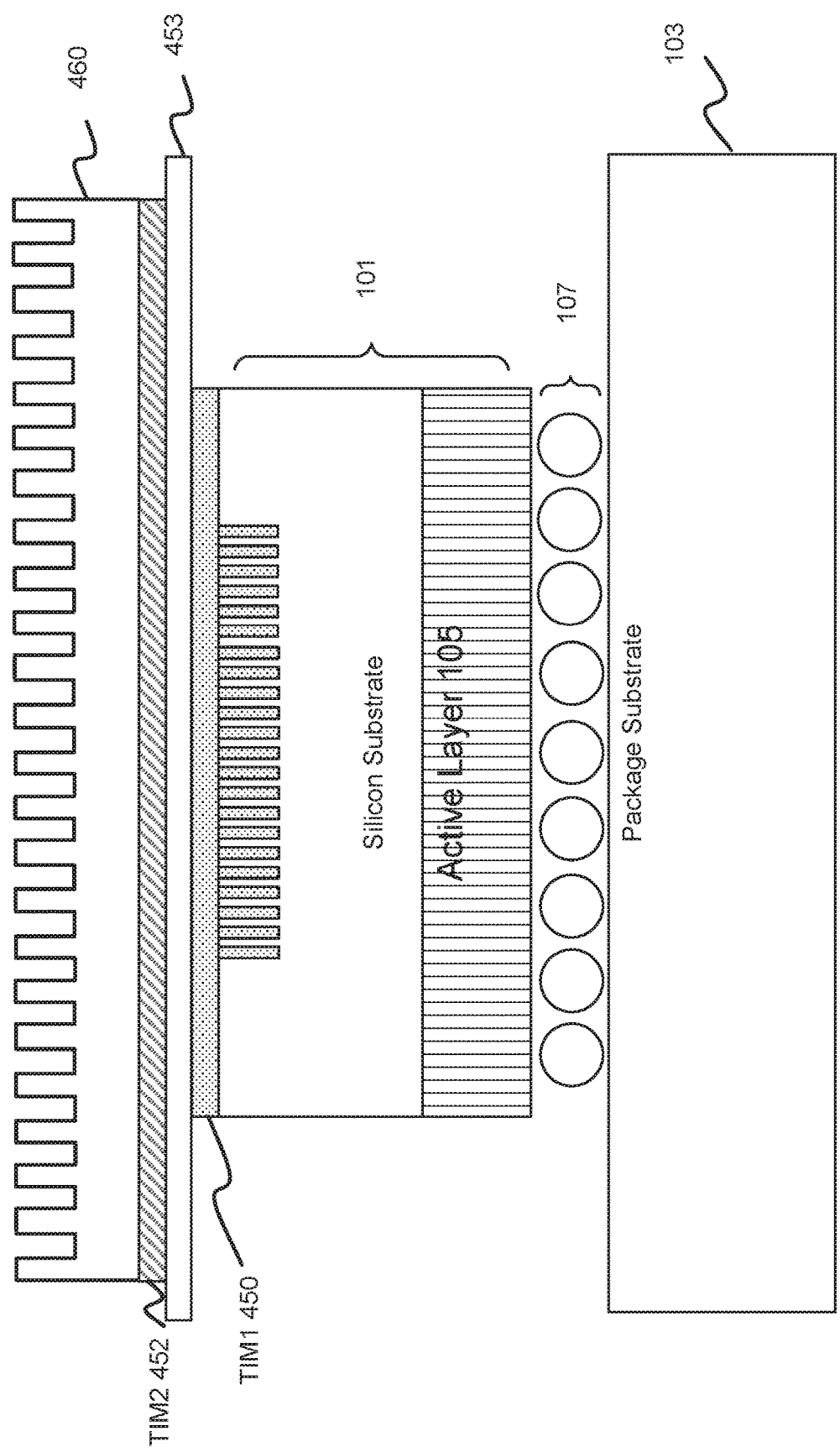
FIG. 7 is the example die of FIG. 6 with the addition of a metal lid provided between a heat sink and the back side of the die, according to some examples.

FIG. 7 thus illustrates a variation of the example packaged die of FIG. 6 with the addition of a metal lid provided between the heat sink and the back side of the die, according to some examples. Thus, only the different aspects of FIG. 7 relative to those in FIG. 6 need be described. With reference to FIG. 7, there is provided above the back side of the die 101 a metal lid 453. As noted above with reference to FIGS. 4 and 5, the lid may be etched with its own pattern of trenches (not shown in FIG. 7), which may, or may not be, in one or more examples, an opposite pattern to that of trenches 110. Because of the addition of lid 453, a first TIM, TIM1 450 is provided between the back side of die 101 and the top side of metal lid 453. On top of metal lid 453, as shown, is provided thermal management device 460. However, between thermal management device 460 and metal lid 453 there Is also provided a TIM, TIM2 452. In some examples, TIM1 and TIM2 may be the same, and in other examples they may be different. As noted above, for example, TIM1 may be made of organic materials such as grease or gel, or of phase change materials, graphite materials or Indium foil or other similar materials. In some examples TIM1 may have, for example, a thickness of between 25 um to 250 um. TIM2 may be made of similar materials as TIM1, and may, in some examples, also have a thickness of between 25 um to 250 um, as well as. As another example, TIM2 may be a gap filler such as, for example, Flex HD300 provided by Laird.

Thus, given the descriptions of FIGS. 6 and 7, for clarity, for a lidless package a TIM material is applied after package assembly is completed, prior to the attachment of a heat sink on to a package, which, in-turn, is mounted on a PCB. On the other hand, for a package with a lid, TIM is applied before the lid is attached to the rest of the package, and then once again on the surface of the lid before a heat sink is applied during assembly to a PCB board. Thus, in this latter example, two TIM layers may be used.

Figure 8:
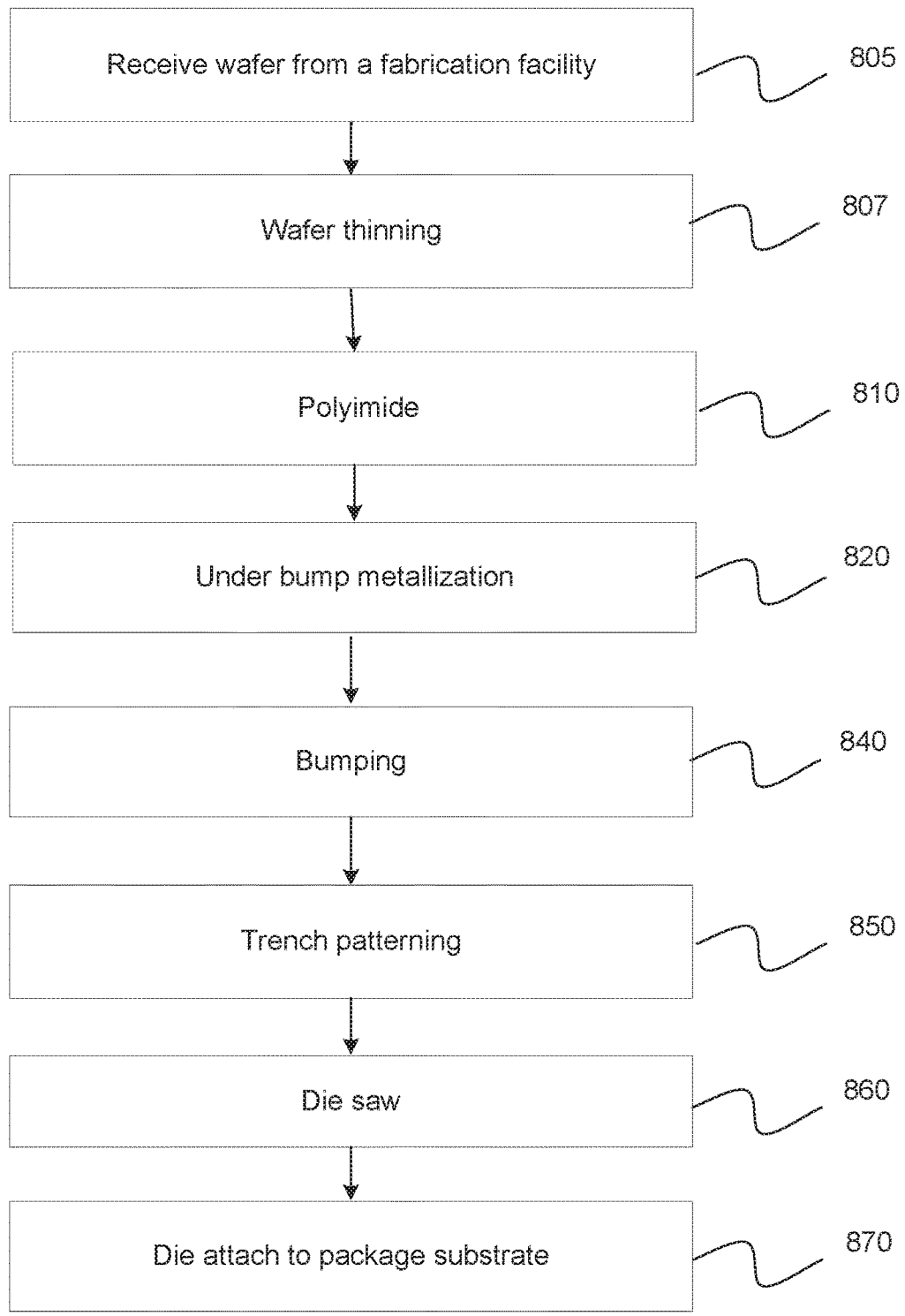
FIG. 8 is a flow diagram of a method for processing a die, according to some examples.

FIG. 8 is a flow diagram of a method 800 for processing a die, according to some examples. In particular, FIG. 8 is an example of how back surface treatment of a die with trench patterning may be incorporated into a typical package assembly flow. Thus, it is noted that most of the assembly steps are similar/close to those in a standard assembly flow, and thus, additional processing as described herein may be easily integrated into device assembly functions that are currently in use.

Method 800 includes blocks 805 through 860. In alternate examples method 800 may include greater, or fewer, blocks. It is noted that blocks 807 through 830 are standard assembly functions, and blocks 850 and 860 standard packaging assembly functions, and thus these need not be described in detail.

Method 800 begins at block 805 where a wafer is received from a fabrication facility. From block 805 method 800 proceeds to block 807, where the wafer is thinned, so as to, for example, give the die the correct thickness. From block 807 method 800 proceeds to block 810, where polyimide is deposited. From block 810 method 800 proceeds to block 820, where under bump metallization is applied. From block 820 method 800 proceeds to block 830, where bumping occurs. This involves, for example, applying a plurality of solder balls to the under bump metallization of the wafer. From block 830 method 800 proceeds to block 840, where the backside of the wafer is patterned with the trenches and other processes according to one or more examples described above.

From block 840 method 800 proceeds to blocks 850 and 860, which describe, it is noted, standard aspects of package assembly. Thus at block 850, a die is sawed from the wafer. From block 850 method 800 proceeds to block 860, where the die is attached to a package substrate, such as, for example, package substrate 103 as shown in FIGS. 6 and 7, via solder bumps 107. Method 800 terminates at block 860.

Figure 9:
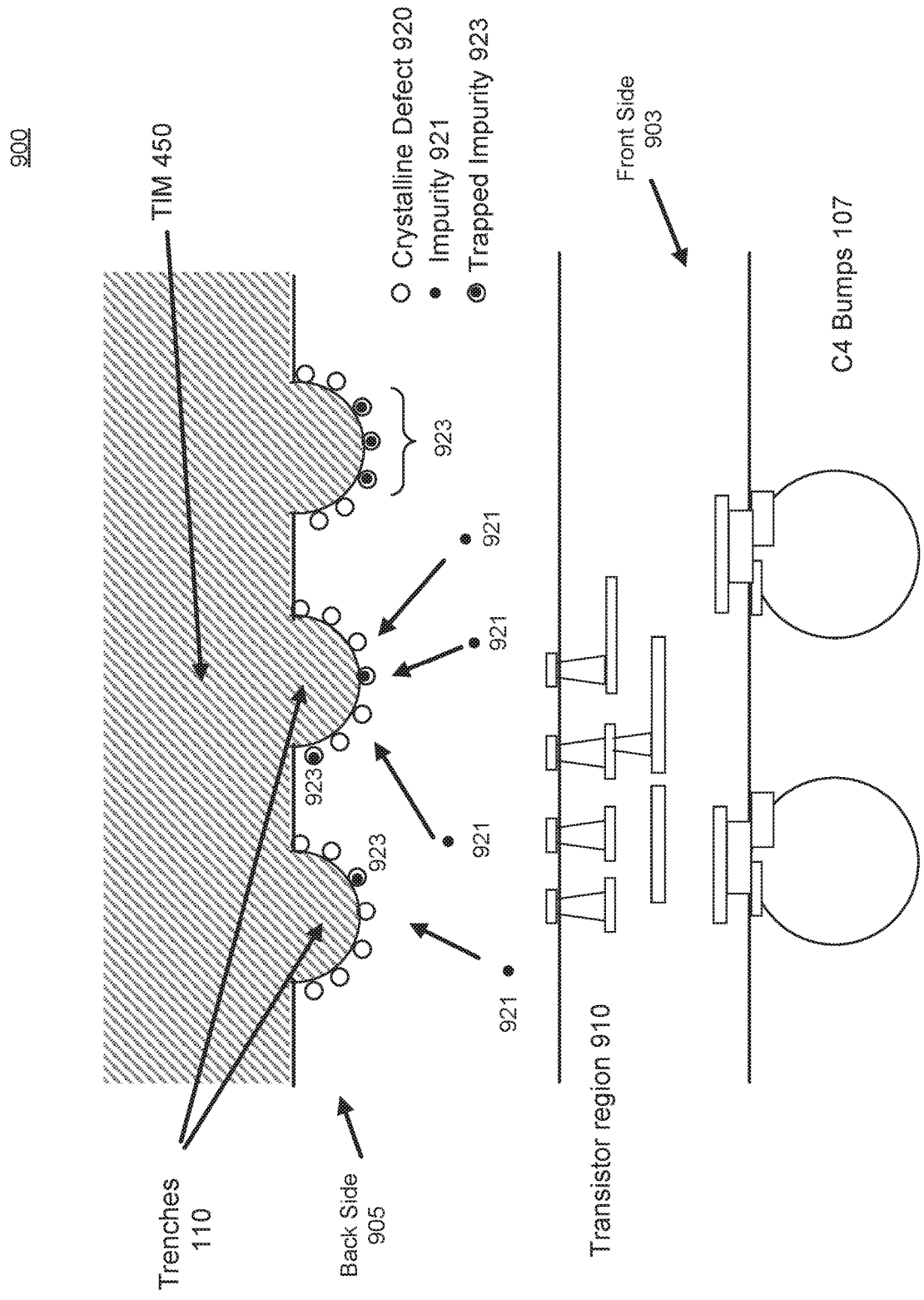
FIG. 9 illustrates a microscopic view of a die after its back side has been treated according to some examples.

FIG. 9 illustrates a microscopic view of an example die after its back side has been treated according to some examples described herein. The example die of FIG. 9 has a front side 903 and a back side 905. Front side 903 includes transistor region 910 where, as shown, a plurality of transistors and various metal layers are provided. The top metal layer of the transistor region 910 is connected to C4 bumps 107, as shown. The back side 905 has been etched with a pattern of trenches 110, and a TIM 450 has been applied to the back side 905 after the trenching was performed. It is noted that the example trenches 110 shown in FIG. 9 are an example of rounded trenches on the back side 905 of the example die. In other examples the trenches 110 may be rectangular, as shown in previous figures.

FIG. 9 further illustrates how the crystalline defects created during trench patterning trap mobile impurities in the substrate and keep them away from the transistor active regions. Thus, as shown in FIG. 9, near the surface of each of the trenches 110 there are a number of crystalline defects 920. Once the crystalline defects 920 are created during trench patterning, they trap impurities 921, thus removing these impurities 910 out of the transistor region 921. When the impurities 921 reach the crystalline defects 920, they are trapped ("gettered"), as illustrated by trapped impurities 923, for example, shown in each of the three trenches of FIG. 9. Moreover, once the impurities 921 become trapped in a crystalline defect 920, they cannot be easily untrapped without significant energy. It is noted that the benefits of gettering, such as, for example, lower PN junction leakage due to less impurities, are well known in the art.

Figure 10:
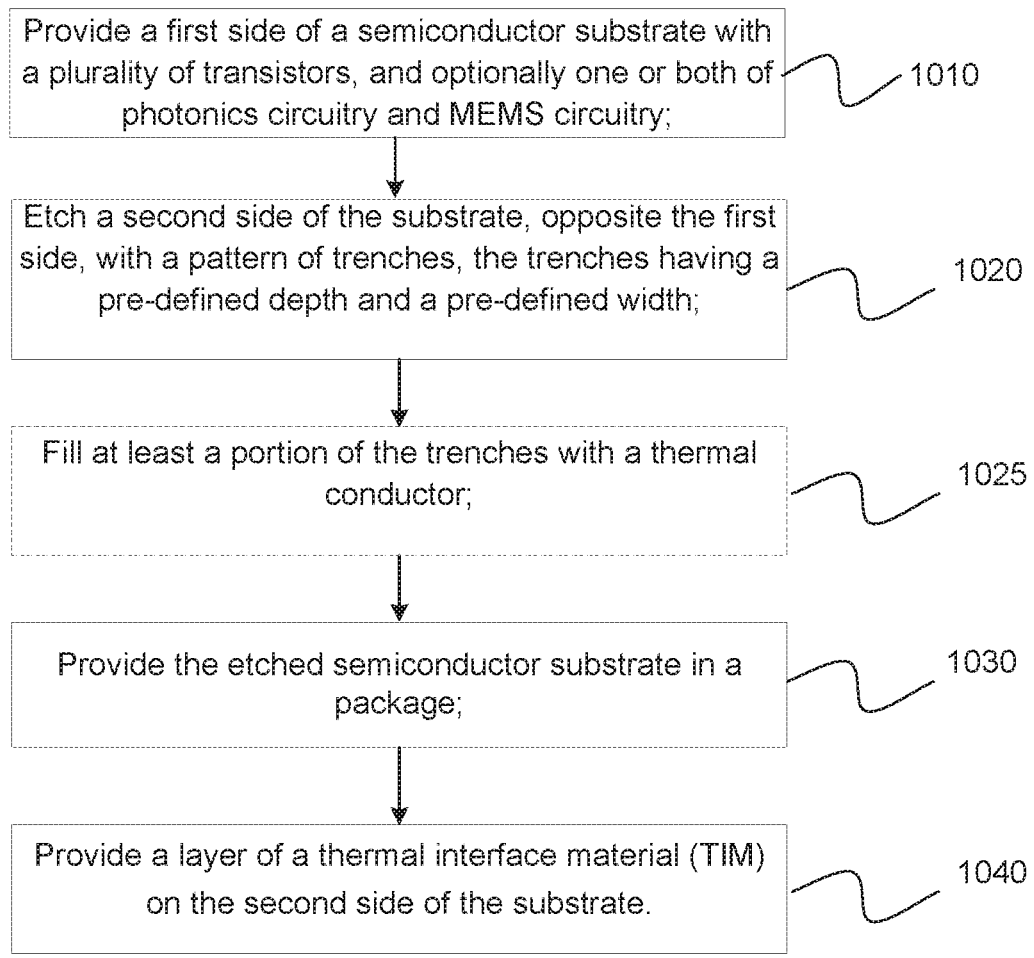
FIG. 10 is a flow diagram of a method for processing a semiconductor substrate to increase its thermal dissipation, according to some examples.

FIG. 10 is a flow diagram of a method 1000 for processing a semiconductor substrate to increase its thermal dissipation, according to some examples. The example method 1000 is described below in the context of the example semiconductor dies shown in FIGS. 1-7 and 9. Other examples can be implemented using other dies, or other semiconductor dies in packages.

Method 1000 includes blocks 1010 through 1040. In alternate examples method 1000 may include greater, or fewer, blocks. It is noted that block 1025 is an optional block, as described below. Method 1000 begins at block 1010 where, a first side of a semiconductor substrate is provided with a plurality of transistors, and optionally, one or both of photonics circuitry and MEMS circuitry. Whether or not photonics or MEMS circuitry is provided is a design choice, and does not affect the heat dissipation functionality provided by method 1000 overall. For example, the first side may be front side 903 shown in FIG. 9, and the plurality of transistors may be those as illustrated in transistor region 910, as described above.

From block 1010, method 1000 proceeds to block 1020, where a second side of the substrate, opposite the first side, is etched with a pattern of trenches, the trenches having a pre-defined depth and a pre-defined width. For example, the second side of the substrate may be back side 905 shown in FIG. 9, and the trenches may be any set of trenches as shown on any of the die substrates shown in FIGS. 1-7 and 9, as described above. As shown in FIG. 1, the trenches may have a pre-defined depth D 135, and a pre-defined width W 130, for example.

From block 1020, method 1000 proceeds to optional block 1025, where at least a portion of the trenches is filled with a thermal conductor. For example, as illustrated in FIGS. 2 and 3, the pattern of trenches may be filled with copper, after first providing a layer of SiN on the back side of the die.

From optional block 1025, if it is performed, or from block 1020 otherwise, method 1000 proceeds method 1000 proceeds to block 1030, where the etched semiconductor substrate is provided in a package. For example, the package may be the package of FIG. 6, 7 or 9, described above.

From block 1030, method 1000 moves to block 1040, where a layer of a TIM is provided on the second side of the substrate. For example, the TIM may be TIM 450 as shown in each of FIGS. 4 (without copper filler in trenches) and 5 (with copper filler first provided in the trenches). 1000 terminates at block 1040.

Thus, according to one or more examples, heat removal from packaged dice may be achieved, with a simultaneous improvement to transistor characteristics. Thus, in one or more embodiments, a valuable thermal management technique is provided for, as an example, advanced PFGA products, especially with the increasing power consumption seen in such devices. Techniques according to various embodiments disclosed herein improve heat removal from dice by increasing the surface area at the back surface of a die. With the increased surface area, more heat conduction can occur from the silicon die to the TIM, and subsequently to a thermal management device such as a heat sink.

During the process of increasing die backside surface area, crystal defects are created in the die substrate near the trenches. Being far away from the active circuit regions, these defects do not adversely impact circuitry in the active region of the substrate. Rather, these crystalline defects become trapping sites for mobile impurities, especially metallic impurities, for example, and thus provide a gettering effect. With these impurities kept away from transistor active regions, PN junction leakage is reduced and transistor performance is improved. In fact, the improved transistor performance and transistor universal curve can, in turn, further assist in thermal management by reducing circuit power consumption without compromising circuit performance.

Thus, methods according to various examples disclosed herein may be applied to AoA 3D packages, as well as, FANOUT, stacked silicon integration technology (SSIT) packages, as well as flip-chip packages, for example. Moreover, as noted, die backside treatment may be done in different ways—with and without metallic filler—depending on heat dissipation requirements and packaging cost targets, and a balancing between package cost and thermal performance.

As used herein (including the claims that follow), a phrase referring to "at least one of" a list of items refers to any combination of those items, including single members. As an example. "at least one of: x, y, and z" is intended to cover: x, y, z, x-y, x-z, y-z, x-y-z, and any combination thereof (e.g., x-y-y and x-x-y-z).

While the foregoing is directed to specific examples, other and further examples may be devised without departing from the basic scope thereof, and the scope thereof is determined by the claims that follow.

What is claimed is:

1. A semiconductor substrate comprising:
   a first side provided with a plurality of transistors;
   a second side, opposite the first side, the second side etched with a pattern of trenches, the trenches having a pre-defined depth and a pre-defined width, wherein the pre-defined depth and width of the trenches is such to increase a surface area of the second side of the semiconductor substrate by at least 20 percent of a surface area of the first side;
   a plurality of crystalline defects formed in the semiconductor substrate immediately adjacent the trenches, the crystalline defects configured to trap mobile impurities in the semiconductor substrate and keep the trap mobile impurities away from the plurality of transistors; and
   conductive metal filling the trenches up to the second side of a semiconductor surface, the second side including portions of the semiconductor substrate exposed between the conductive metal filled trenches.

2. The semiconductor substrate of claim 1, wherein the semiconductor substrate is one of:
   a top die of an active-on-active 3D package,
   a top die provided on an interposer in an SSIT package,
   a glass interposer,
   a die in a fan-out package, or
   a die in a flip-chip package.

3. The semiconductor substrate of claim 1, wherein the conductive metal filling the trenches is one of copper or an alloy that includes copper.

4. The semiconductor substrate of claim 1, further comprising a layer of a TIM on the second side of the semiconductor substrate, the layer of TIM covering the conductive metal filled trenches.

5. The semiconductor substrate of claim 4, wherein the pattern of trenches is a first pattern, and further comprising one of a heat sink or a package lid, wherein the heat sink or the package lid has a second pattern of trenches on an underside, the underside provided on top of the layer of the TIM.

6. The semiconductor substrate of claim 1, wherein the conductive metal filing the trenches is plated copper.

7. The semiconductor substrate of claim 5, further comprising the package lid, and wherein the TIM is a first TIM, and further comprising:
   a layer of a second TIM on an upper side of the package lid; and
   a heat sink on top of the layer of the second TIM.

8. The semiconductor substrate of claim 1, wherein the semiconductor substrate is made of a semi-conductor material including includes one of silicon, glass, organic materials, or ceramics.

9. A semiconductor substrate comprising:
  a first side provided with a plurality of transistors;
  a second side, opposite the first side, the second side etched with a pattern of trenches, the trenches having a pre-defined depth and a pre-defined width;
  a copper filler filling each of the trenches up to the second side of a semiconductor surface; the second side including portions of the semiconductor substrate exposed between the conductive metal filled trenches;
  a plurality of crystalline defects formed in the semiconductor substrate immediately adjacent the trenches, the crystalline defects configured to trap mobile impurities in the semiconductor substrate and keep the trap mobile impurities away from the plurality of transistors;
  at least one of a heat sink or a package lid disposed over the second side of the semiconductor substrate, one of the heat sink or the package lid has a an underside facing the semiconductor substrate; and
  a layer of TIM contacting the exposed portions of the second side of the semiconductor substrate, the copper filler filing the trenches, and the underside of one of the heat sink or the package lid.

* * * * *